(12) United States Patent
Gemar et al.

(10) Patent No.: US 7,049,632 B2
(45) Date of Patent: May 23, 2006

(54) METHOD AND APPARATUS FOR OPTICAL PROBING OF INTEGRATED CIRCUIT OPERATION

(75) Inventors: Jeff R. Gemar, Superior, CO (US); Mark J. Erlenborn, Naperville, IL (US); George Harper, Weston, MA (US); Keith A. Kind, Mission Viejo, CA (US); Welborn R. Malpass, Evergreen, CO (US); Sam L. Spencer, San Diego, CA (US); Kewei Yang, San Jose, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 90 days.

(21) Appl. No.: 10/330,798

(22) Filed: Dec. 24, 2002

(65) Prior Publication Data

US 2004/0119069 A1   Jun. 24, 2004

(51) Int. Cl.
   *H01L 23/58* (2006.01)
(52) U.S. Cl. .......................................... 257/48; 257/88
(58) Field of Classification Search ................ 257/48, 257/88; 438/18, 34
   See application file for complete search history.

(56) References Cited

U.S. PATENT DOCUMENTS

| | | | | |
|---|---|---|---|---|
| 4,818,896 A | * | 4/1989 | Cavanna | 326/90 |
| 4,906,922 A | * | 3/1990 | Takahashi et al. | 324/753 |
| 4,922,194 A | * | 5/1990 | Gaussa et al. | 324/158.1 |
| 5,363,088 A | * | 11/1994 | Schweitzer, Jr. | 340/660 |
| 6,654,331 B1 | * | 11/2003 | Wilson et al. | 369/53.34 |
| 2004/0117142 A1 | * | 6/2004 | Pillai | 702/118 |

* cited by examiner

*Primary Examiner*—Tuan H. Nguyen

(57) ABSTRACT

Optical transducers disposed on an integrated circuit correspond to test points thereon. The state of optical transducers perceived by an optical sensor is correlated to test points. Alignment of the optical sensor relative to the optical transducers is accomplished electronically or mechanically.

6 Claims, 8 Drawing Sheets

METHOD AND APPARATUS FOR OPTICAL PROBING OF INTEGRATED CIRCUIT OPERATION

FIELD OF THE INVENTION

This invention relates generally to the field of testing integrated circuits.

BACKGROUND OF THE INVENTION

Physically, electronic semiconductors are fabricated by etching geometric patterns into wafers of silicon or other semi-conductive material. The geometric patterns are typically used to define regions on the wafer that will be chemically doped in order to create transistors and various other devices. By providing conductive paths on the wafer, devices such as transistors can be electrically connected to other transistors or devices in order to form very complex circuits. The resulting circuits are known as "integrated circuits".

Integrated circuits are much like any other electronic system. A collection of functional circuits may be combined to accomplish a particular function. In many ways, an integrated circuit can be compared to a printed circuit board that is populated with transistors and other components. Where the printed circuit board uses traces etched from a copper sheet adhered to its surface to connect components together, the integrated circuit uses the conductive paths to connect one component to the next.

When a printed circuit board is assembled, it generally needs to be tested to make sure it is functioning properly. Modernly, testing of circuit boards requires attachment of the circuit board to a test system. The test system normally uses a multiplicity of physical connections to monitor the state of "test points" on the circuit board. These test points are normally defined when the circuit board is first designed. They are usually selected because the activity that is exhibited at the test point is indicative of the overall health of the completed circuit board being tested. Literally, the number of test points that must be monitored to test a complicated circuit board may reach into the hundreds, but many circuit boards may be tested with less than a hundred test points. In most instances, all of the test points must be monitored simultaneously. This means that a separate physical connection must be provided from each test point to the test system.

Testing an integrated circuit is just as, or perhaps even more complicated than testing an assembled circuit board. First, the integrated circuit is usually tested at several stages of the manufacturing process. When the integrated circuit is manufactured, it is generally fabricated on a wafer. The wafer may actually contain hundreds of instances of the same integrated circuit pattern. After the wafer is fabricated, it is physically sawed apart to separate the individual integrated circuits into die. Each resulting die is a fungible product that may eventually be shipped to a customer as an integrated circuit.

Before an individual die can be shipped, it is usually encapsulated into a plastic molded package. Pins of a plastic package are connected with micro-fine wires to connection points on the integrated circuit that are known as bonding pads. The bonding pads are normally much larger than other features on an integrated circuit because each bonding pad must be large enough to accommodate a connection wire. The pins protrude through the encapsulant so that the integrated circuit can be connected to a circuit board like any other electronic component.

The task of packaging an integrated circuit is very time consuming and expensive. This means that individual die must be tested before they are packaged to ensure that defective components are not packaged. Once the device is actually packaged, it must be tested again to verify that the packaging was properly done. This is usually performed to make sure that all of the physical connections from the bonding pads on the integrated circuit are all connected to the pins that are used to connect the integrated circuit to a printed circuit board.

Testing an integrated circuit is difficult, due mainly to its miniature features. In order to properly test an integrated circuit, additional bonding pads may need to be provided on the silicon die. Because bonding pads are so much larger than other circuit elements, they waste space that could otherwise be used for functional circuitry. As a result, the number of components that can be produced from a single wafer, or yield, may be reduced. For this reason, many integrated circuit designs limit the number of additional test points that are provided for functional testing.

Testing an unpackaged integrated circuit is also physically dangerous to the device under test. In order to make contact with the bonding pads on an integrated circuit, a physical connection is normally made by means of an apparatus known as a "flying probe". The flying probe is a robotic electrical probe that can be directed numerically to a bonding pad. The contact pressure that the flying probe exerts on the bonding pad may also damage the integrated circuit.

Once the integrated circuit is packaged, it may still be damaged during the testing process. Semiconductors are very susceptible to damage at a molecular level by electrical static discharge (ESD). Whenever two different materials come in contact with each other, there is a voltage difference between them. If the voltage difference is large enough, a sudden current flow may be induced as the voltage between the two materials equalizes. During testing, the integrated circuit may be damaged if it comes into contact with another object. If the voltage difference between the integrated circuit and the other object, such as a test probe or human being, is large enough, the static discharge may damage the device. This kind of ESD damage can also occur when the integrated circuit is tested before it is packaged.

Recognizing the problem of handling integrated circuits during testing, White et al. (U.S. Pat. No. 6,331,782) teaches that a test point on an integrated circuit can be monitored wirelessly. According to White, the electrical state of a test point can be used to modulate a carrier or effect some other wireless communications such as electromagnetic coupling or optical signals. A test apparatus can demodulate the carrier or receive a different wireless conveyance in order to monitor the status of the test point.

Although White addresses the issues of physical damage that can be associated with contact-oriented probing of an integrated circuit, his method does not address the real problem with testing an integrated circuit, or for that matter, even a complicated printed circuit board assembly. In order to be effective, any contact-oriented testing method must be capable of simultaneously monitoring a plurality of test points. Whether the testing involves an integrated circuit, a printed circuit board or some higher-level electronic assembly, a test apparatus must have simultaneous access to the test points in order to properly validate circuit operation.

The flying probe can only make a very limited number of simultaneous connections. Anyway, the physical area of each bonding pad may limit the number of test points; the number of contact limitations of the flying probe may be moot in this instance. White's wireless technique is limited to only one test point. In fact, White admits that if additional test points need to be monitored, additional carriers at other frequencies must be used. In one alternative, White suggests that a spread spectrum transmitter could be used to convey the state of a plurality of test points on an integrated circuit; each test point could be distinguished by a different spread-spectrum frequency hopping sequence. Either of these methods would require significant and very complex circuitry on the integrated circuit. This additional circuitry could have a counterproductive effect on production yield much like that associated with the use of an excessive number of bonding pads for individual test points.

SUMMARY OF THE INVENTION

The present intention comprises a method for fabricating integrated circuits that does not require the use of a flying probe or other mechanical contact with the integrated circuit substrate in order to simultaneously validate the operation of the plurality of test points. First, test points need to be identified in the integrated circuit. Typically, the integrated circuit will have an application-specific portion. Within the application-specific portion of the integrated circuit, individual test points may be identified according to one illustrative method of the present intention.

Once the test points identified, the present method teaches that optical transducers be provided on the integrated circuit. According to one illustrative method of the present invention, one optical transducer is generally provided for each test point. During testing of the integrated circuit, the state of each optical transducer may be driven according to the electrical state of its corresponding test point. In order to determine the state of each test point in an essentially parallel manner, one example method of the present invention provides for concurrently perceiving the state of the plurality of optical transducers.

Further enhancing the test ability of an integrated circuit fabricating according to the method of the present invention, one derivative method provides that the optical transducers should be aligned to match the orientation of an optical sensor that may be used to perceive their optical state. Once aligned, the optical sensor may generate an image signal that represents the state of each optical transducer.

In many cases, sampling of test points in an integrated circuit subject to testing may require synchronization. Hence, according to one variation of the present method, one of the optical transducers may be driven by a capture signal. In this case, an image signal may be generated by an optical sensor. In order to provide for synchronous capture of the state of all optical transducers, the signal representing the image perceived by the optical sensor may be stored when a portion of the image signal corresponding to the capture signal is perceived to be "active".

The image signal may be an analog video signal or it may be a serial bitstream that represents the state of the plurality of optical transducers disposed on the integrated circuit. According to one derivative method, the image signal may be converted into a bitmap and the individual bits and a bitmap may then be correlated to the optical transducers. This provides an essentially one-for-one correlation of test points to the state of bits in a bitmap.

In many cases, test points within the application-specific portion of the integrated circuit may need to be sampled in an analog manner. In this case, one example method provides that an analog test point should be identified within the application-specific portion of the integrated circuit. An analog-to-digital converter may then be used to convert the voltage level present at the analog test point into a multi-bit digital value. The multi-bit digital value may then represents the voltage level present at the analog test it. Each bit in the multi-bit digital value may then be used to drive a distinct optical transducer. This allows parallel transfer of the digital value to an optical sensor that may be used to perceive the state of the optical transducers comprising the integrated circuit.

One variation of the example method described herein provides that the state of an optical transducer may be driven by causing the optical transducer to emit optical energy if the voltage level present at its corresponding test point exceeds a pre-established threshold. Typically, this may imply that an optical transducer is a light emitting element, for example a light emitting diode. In yet another derivative method that illustrates one feature of the present invention, optical transducers corresponding to individual test points may be driven by causing the optical transducer to vary is reflective if the voltage level present at a test point exceeds a pre-established threshold. This may be accomplished by providing a liquid crystal light valve. The light valve may be backed by a reflective material.

According to one variation of the present method, the alignment of an optical sensor relative to optical transducers disposed on an integrated circuit may be adjusted through the use of a registration reference. The registration reference may be incorporated into the integrated circuit. For instance, the registration reference may be the periphery of the integrated circuit itself or it may be a registration pattern embossed onto the surface of the integrated circuit. It should be noted, that the scope of the present invention is not intended to be limited to any particular type of registration reference that may be used to aid in the alignment of the optical transducers with the optical sensor.

Aligning the optical transducers with the optical sensor may be accomplished algorithmically. Hence, the image perceived by the optical sensor may be adjusted using the registration reference in order to orient specific optical transducers with an anticipated pattern for a particular integrated circuit. This ensures that particular optical transducers may be properly correlated with their respective test points in an image signal that may be generated by the optical sensor.

According to one variation of the present method, the state of a plurality of optical transducers may be concurrently perceived by receiving an image through a focusing lens. The image may then be imparted to an array of optically sensitive detectors. An electrical signal for each detector may then be generated according to the amount of optical energy incident on that particular detector.

An integrated circuit fabricated according to the method of the present invention may generally comprise application-specific circuitry having a plurality of test points. The present invention may therefore comprise an integrated circuit that itself comprises a plurality of optical transducers and a plurality of optical transducer drivers. Typically, the optical transducer drivers will drive the optical transducers in accordance with the state of the plurality of test points identified within the application-specific portion of the integrated circuit. To facilitate alignment of the optical transducers with an optical sensor, the integrated circuit of the present invention may further comprise an alignment mark.

According to one alternative embodiment of the present invention, the integrated circuit may further comprise an optical transducer that is driven by a state capture signal. This state capture signal may be perceived by an optical sensor and used to facilitate synchronous capture of the optical state of the optical transducers comprising the integrated circuit. One example of embodiment of the present invention provides that the optical transducers may be light emitting diodes. According to yet another alternative embodiment of the present invention, the optical transducers may liquid crystal light valves. These may be overlaid on a reflective material to enhance light-to-dark contrast ratio. Liquid crystal light valves may be driven by thin film transistors.

The invention may further comprise an apparatus for testing an integrated circuit. According to one embodiment of the present invention, a test apparatus may comprise an optical sensor and an analysis unit. According to this illustrative embodiment of the present invention, the optical sensor may generate an image signal that reflects the state of each optical transducer on an integrated circuit. The analysis unit may then convert the image signal into a plurality of test point states. These may then be used to ascertain the functional health of the integrated circuit under test.

According to one alternative embodiment of the present invention, the analysis unit may store the image signal when a portion of the image signal representing a capture signal is active. The analysis unit may further comprise an image alignment unit that electronically adjusts the image signal in order to correlate the image of optical transducers relative to a registration reference. According to yet another alternative embodiment of the invention, the testing apparatus may further comprise a positioning unit that adjusts the orientation of the optical sensor relative to the registration reference. In one embodiment of the invention, the optical sensor comprises an array of light sensitive detectors.

BRIEF DESCRIPTION OF THE DRAWINGS

The foregoing aspects are better understood from the following detailed description of one embodiment of the invention with reference to the drawings, in which.

DETAILED DESCRIPTION OF THE INVENTION

Modern fabrication techniques that yield high-quality integrated circuits often provide sophisticated test methods for ensuring that a finished integrated circuit complies with all relevant operational specifications. Today, there is a new method for fabricating integrated circuits that provides for concurrent sampling of test points integral to an application-specific portion of the circuit without the need for mechanical contacting apparatus to affect the sampling.

Figure 1:
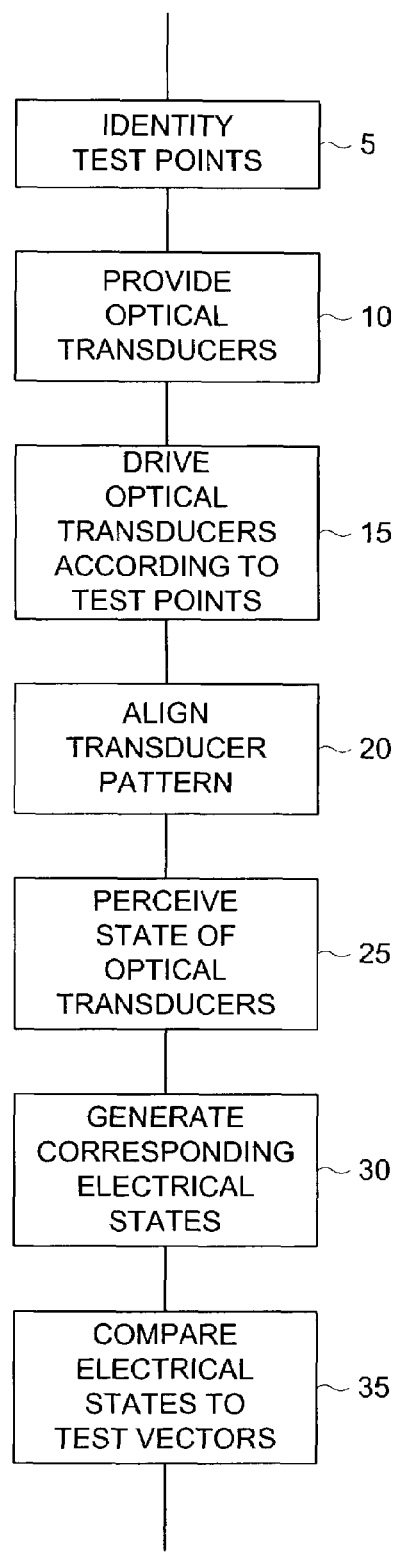
FIG. 1 is a flow diagram that depicts one illustrative method for fabricating integrated circuits that utilizes optical probing according to the present invention.

FIG. 1 is a flow diagram that depicts one illustrative method for fabricating integrated circuits that utilizes optical probing according to the present invention. Generally, an integrated circuit having an application-specific circuit portion will be fabricated according to the present method. First, test points within the application-specific portion of the integrated circuit may be identified (step 5). For every test point identified, an optical transducer may be provided (step 10).

As the integrated circuit operates, one example method provides that the optical transducers are to be driven according to the electrical state present at a corresponding identified test point (step 15). During testing, the optical transducers provided on the integrated circuit may need to be aligning with an optical sensor (step 20). It should be noted that the method of the present invention may be applied in situations where alignment is simply not necessary. For instance in a fabrication facility wherein integrated circuits are handled using exceptionally precise robotic means, placement of the integrated circuit in a test apparatus may imply specific alignment with the transducers on the integrated circuit with the optical sensor. Accordingly, in this fabrication scenario, alignment is inherent and is not necessarily a separate step in the manufacturing process.

In furtherance of the manufacturing process, one illustrative method provides that the state of the optical transducers be perceived (step 25) as the integrated circuit comprising the optical transducers undergoes testing. Once the state of the optical transducers is perceived, which is typically accomplished in a concurrent manner, the electrical states corresponding to the identified test points may be generated (step 30). These may optionally be compared to test state vectors (step 35) in order to ascertain the functional integrity of an integrated circuit under test.

Some integrated circuits may require testing in a synchronous fashion. Hence, perception of the optical state of the optical transducers may need to be accomplished in conjunction with a capture signal. According to one illustrative method of the present invention, an optical transducer may be driven with a capture signal. Synchronous sampling of the optical state of all optical transducers may then be accomplished by generating an image signal representative of the state of each optical transducer and then storing the image signal when a portion of the image signal that corresponds to the capture signal is perceived to be active.

Figure 2:
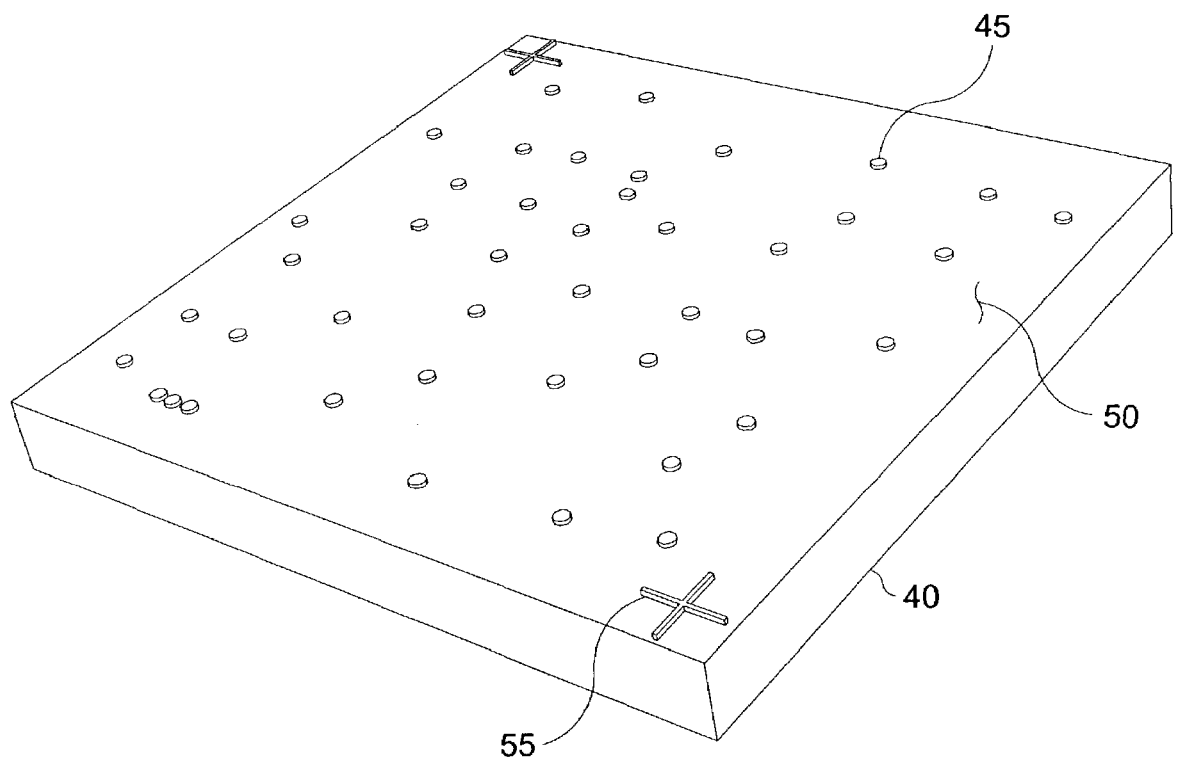
FIG. 2 is a perspective view of an example integrated circuit comprising optical transducers than may be used to test the operation of the integrated circuit according to the method of the present invention.

FIG. 2 is a perspective view of an example integrated circuit comprising optical transducers than may be used to test the operation of the integrated circuit according to the method of the present invention. The method of the present invention may be used to test the integrated circuit before it is assembled into a physical package. Typically, an integrated circuit in this state is said to be a single "die" 40. It should be noted that the method of the present invention may be used at any stage of integrated circuit fabrication, including but not be limited to pre-dicing, die state and packaged components. For the purposes of this discussion, the pre-dicing state may be considered that state in the fabrication process where multiple instances of an integrated circuit may be found on a single substrate, or "wafer". Typical integrated circuit manufacturing processes may then separate individual components by physically "sawing" the wafer into individual die. Further through the manufacturing process, individual die may be packaged into a physical package. In order to utilize the method of the present invention, packaged integrated circuits may need to be packaged into a "windowed" package. The method of the present invention may also be applied in the fabrication of hybrid circuits wherein one or more individual die are attached to a mounting substrate and connected to the mounting substrate using either wire bonding or other appropriate electrical connections.

According to one illustrative method of the present invention, a plurality of optical transducers 45 may be disposed proximate to the top surface of the integrated circuit 50. As application-specific portions of the integrated circuit operate, the state of test points may be represented by the optical state of the plurality of optical transducers 45. In some applications of the present method, optical transducers may be disposed on the bottom surface of the integrated circuit. Optical transducers may likewise be disposed anywhere along the periphery of the integrated circuit or any other convenient place where they may be optically perceived.

In one derivative method of the present invention, a pattern of optical transducers may need to be aligned with an optical sensor. To facilitate such alignment, the method of the present invention may provide for registration references 55. Registration references 55 may be disposed proximate to the top surface of the integrated circuit 50 and may further be placed in opposing corners of the integrated circuit. Registration references may also be the boundary of an integrated circuit itself.

Figure 3:
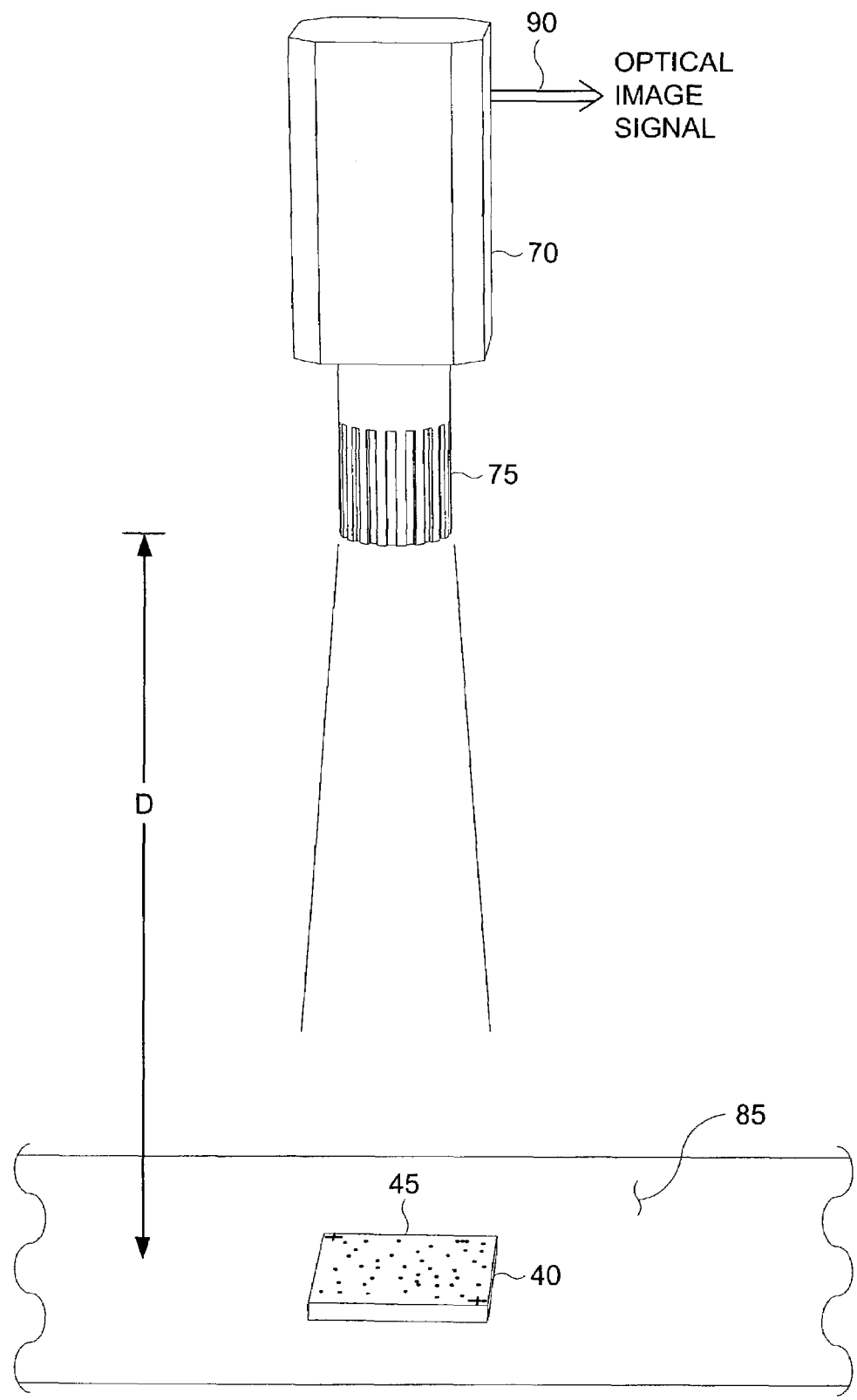
FIG. 3 is a pictorial representation of one example test apparatus that may be used to optically probe integrated circuits according to the method of the present invention.

FIG. 3 is a pictorial representation of one example test apparatus that may be used to optically probe integrated circuits according to the method of the present invention. One derivative method of the present invention provides that the state of optical transducers disposed on an integrated circuit 40 may be perceived by receiving an image through a focusing lens 75 onto an optically sensitive detector. According to one variation of this method, the image may be focused on to an array of optically sensitive detectors. In either case, an electrical signal may be generated according to the amount of optical energy incident on the detector or array of detectors. Typically, the optically sensitive detector(s) may be integrated into an optical sensor 70.

As an integrated circuit 40 is tested, it may be placed on a test platform 85. The optical sensor 70 may then be positioned above the test platform 85 at an appropriate distance "D". An image representing the state of the optical transducers 45 may then the captured through a focusing lens 75. This may result in an optical image signal 90 that represents the state of the optical transducers 45 as perceived by the optical sensor 70.

Various derivative methods of the present invention provide for altering the state of an optical transducer according to the electrical state of a corresponding test point. Typically, the electrical state of a corresponding test point is represented in a binary manner. According to one variation that illustrates a feature of the present method, an optical transducer may be induced to change either its color or reflectivity in order to vary in contrast with a background. Hence, one variation of the present method may cause an optical transducer to become more reflective when the voltage level at a corresponding test point exceeds or falls below the pre-established threshold. According to yet another variation of the present method, an optical transducer may be induced to emit optical energy according to the electrical state of a corresponding test.

Figure 4:
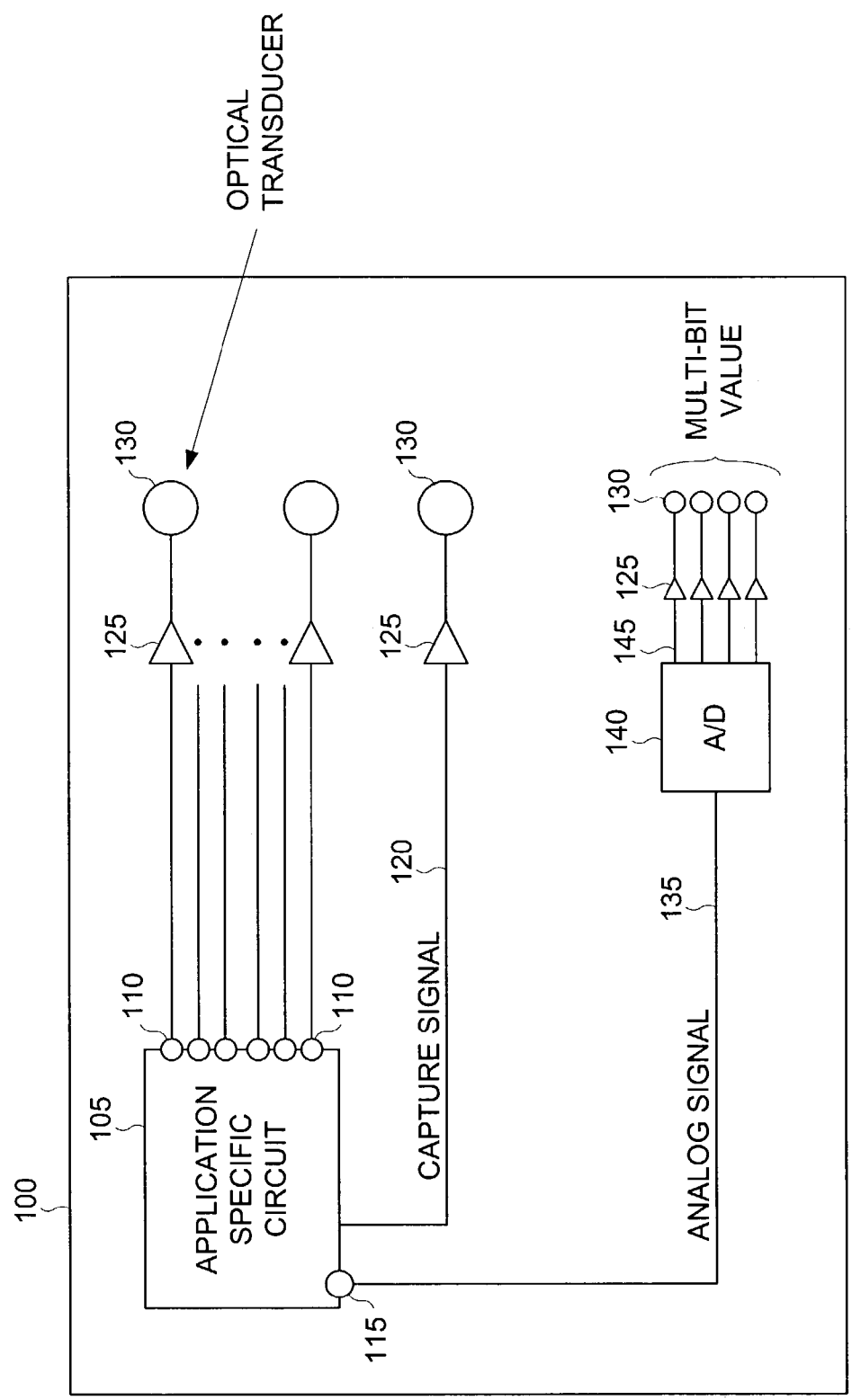
FIG. 4 is a block diagram that depicts one possible embodiment of an integrated circuit that may be probed optically according to the method of the present invention.

FIG. 4 is a block diagram that depicts one possible embodiment of an integrated circuit that may be probed optically according to the method of the present invention. This illustrative embodiment of an integrated circuit 100 may comprise an application-specific circuit 105 and a plurality of optical transducers 130. The application specific circuit 105 typically has a plurality of test points 110. Typically, the test points reflect the electrical signal level of various key circuit paths within the application-specific circuit 105. According to at least one embodiment of an integrated circuit 100 of the present invention, test points 110 reflect a binary signal generated by digital logic within the application-specific circuit 105. According to one alternative embodiment of the integrated circuit 100, the application-specific circuit 105 may further comprise analog test points 115. In yet another alternative embodiment, the application-specific circuit 105 may generate a capture signal 120 that may be used to facilitate synchronous capture of the electrical state present at a plurality of test points 110 or analog test points 115.

In the case where a test point 110 provides a binary logic level, a driver 125 may be used to receive a logic level from a test point 110. The driver 125, which may further comprise the integrated circuit, may then be used to drive an optical transducer 130 corresponding to the test point 110. Generally, the driver 125 may convert the logic level present at the test point 110 into a signal that may vary the optical state of the optical transducer 130 corresponding to the test point 110. According to at least one illustrative embodiment of the present invention, the capture signal 120 may be a binary signal. Hence, a driver 125 may receive the capture signal 120. An optical transducer 130 may then be driven by the driver 125 to reflect the state of the capture signal 120.

According to one alternative embodiment of the present invention, an analog test point 115 may generate an analog signal 135. The analog signal 135 may be presented to an analog-to-digital converter 140 that may further comprise the integrated circuit. According to this illustrative embodiment, the analog-to-digital converter 140 may convert the voltage level exhibited by the analog signal 135 into a plurality of parallel binary data bits 145. Each of these binary data bits 145 may then be direct into a corresponding driver 125 in order to drive an optical transducer 130. Because all of the bits representing an analog value are generated in a parallel manner, the voltage level may be perceived by concurrently perceiving the optical state of the optical transducers 130 corresponding to the parallel binary data bits 145 generated by the analog-to-digital converter 140.

Various types of optical transducers may be utilized in the fabrication of an integrated circuit according to the present invention. According to one alternative embodiment, optical transducers may be light generating devices. For instance, light emitting diodes may comprise the optical transducers. In yet another alternative embodiment, optical transducers may vary in transmissivity. One example of these types of optical transducers may include, but should not be limited to a liquid crystal light valve. In one alternative embodiment, a liquid crystal light valve may be positioned over a reflective surface. Hence, when the liquid crystal light valve is open the reflective surface is exposed causing a shift in contrast ratio relative to the surface region of an integrated circuit surrounding the liquid crystal light valve. In yet another alternative embodiment, disposing the liquid crystal light valve above a colored surface may also vary contrast ratio. Closing or opening the liquid crystal light valve may vary the color of an optical transducer resulting in a shift in contrast ratio.

Figure 5:
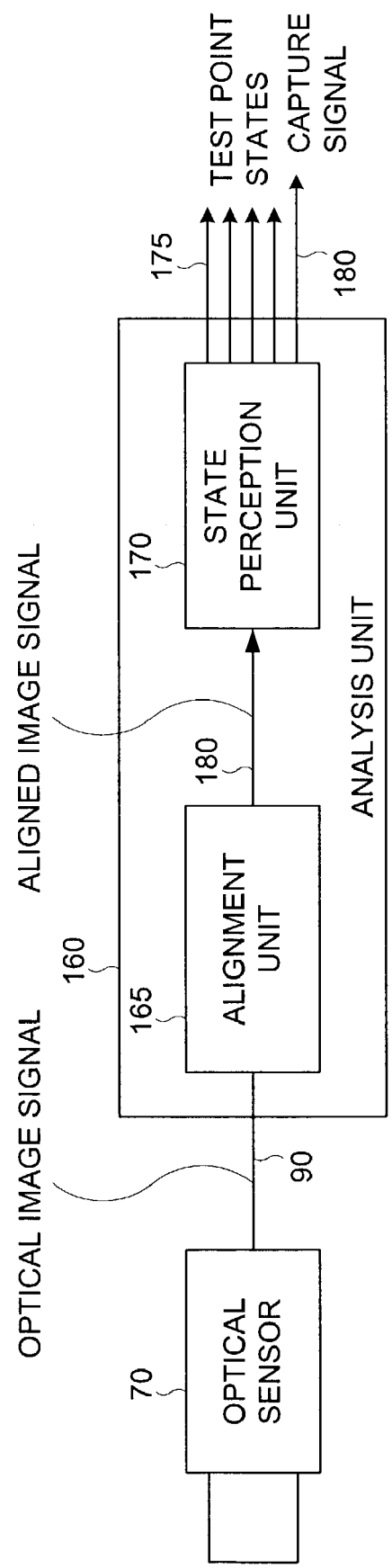
FIG. 5 is a block diagram that depicts one example embodiment of a test apparatus that may be used to optically probe integrated circuits according to the present invention.

FIG. 5 is a block diagram that depicts one example embodiment of a test apparatus that may be used to optically probe integrated circuits according to the present invention. A test apparatus may comprise an optical sensor 70. The test apparatus may further comprise an analysis unit 160. The analysis unit 160 may be comprised of an alignment unit 165 and a state perception unit 170. According to one alternative embodiment of the present invention, the alignment unit 165 may receive an optical image signal 90 from the optical sensor 70. Typically, the optical image signal represents the state of all optical transducers comprising an integrated circuit as perceived by the optical sensor 70. Typically, the optical sensor 70 generates the optical image signal based on perceiving the state of all optical transducers in a concurrent manner. The optical sensor may comprise a video camera having either a single light-sensitive detector or an array of light-sensitive detectors.

The alignment unit 165 may correct the optical image signal for any misalignment of a pattern of optical transducers disposed on an integrated circuit relative to the optical sensor 70. The state perception unit 170 may receive an aligned image signal 180 from the alignment unit 165. Using the aligned image signal 180, the state perception unit 170 may correlate various portions of the aligned image signal 180 to specific test points as they may correspond to optical transducers perceived by the optical sensor 70. A plurality of test point states 175 may then be generated. The state perception unit 170 may also correlate a portion of the aligned image signal with an optical transducer that corresponds to a capture signal. The state perception unit 170 may then provide the state of the capture signal 180. The test point states 175 may be sampled according to the capture signal 180 according to one alternative embodiment of the invention. Generally, the test apparatus may receive a plurality of test point states 175 that corresponds to a plurality of parallel data bits representing the voltage level present at an analog test point. In this case, test point states 175 corresponding to the parallel data bits may be used as a numerical indication of the voltage level present at the analog test point.

Figure 6:
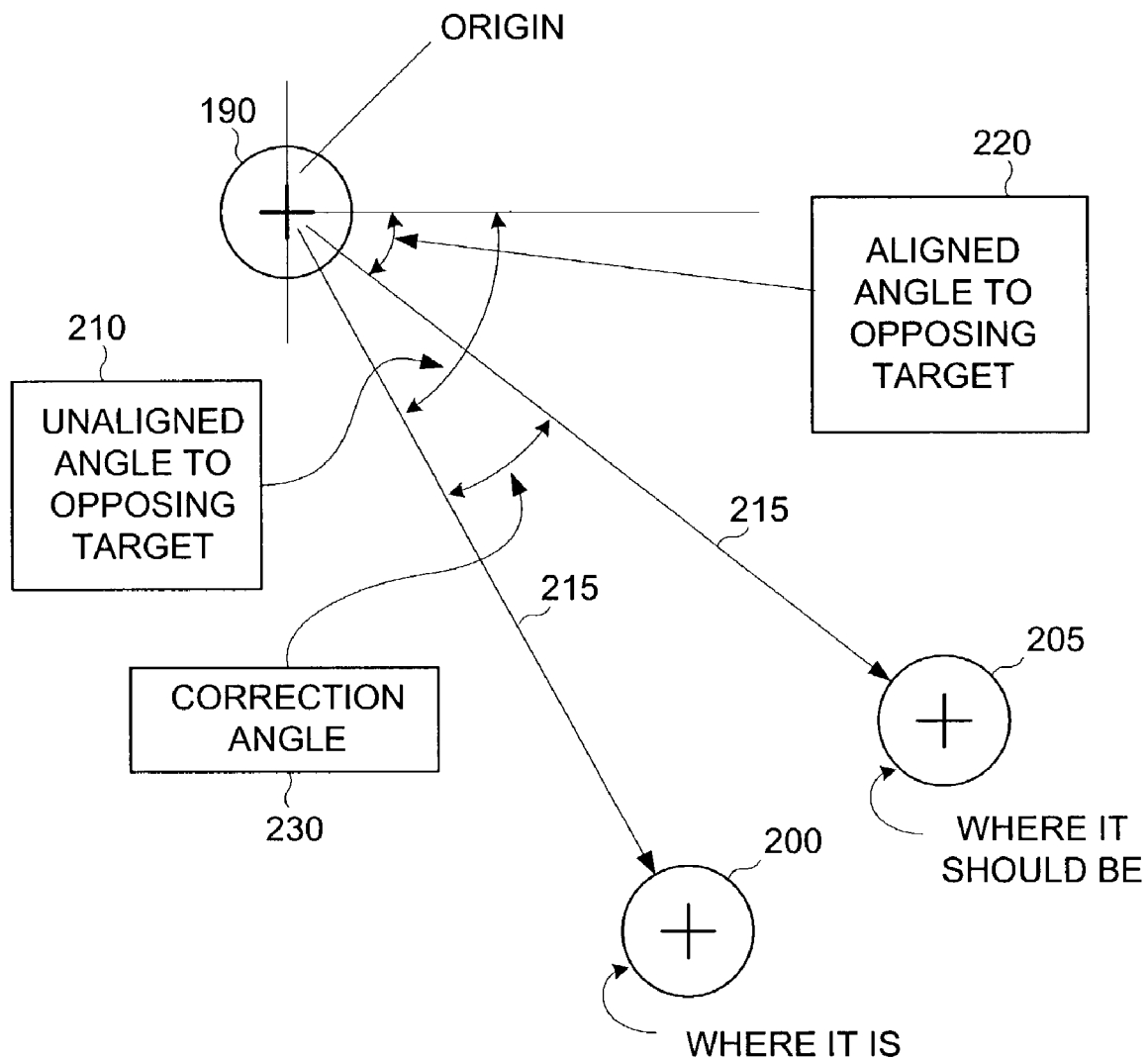
FIGS. 6 and 7 are pictorial diagrams that depict one example process for electronically aligning optical transducers with an optical sensor according to one example embodiment of an alignment unit according to the present invention.
Figure 7:
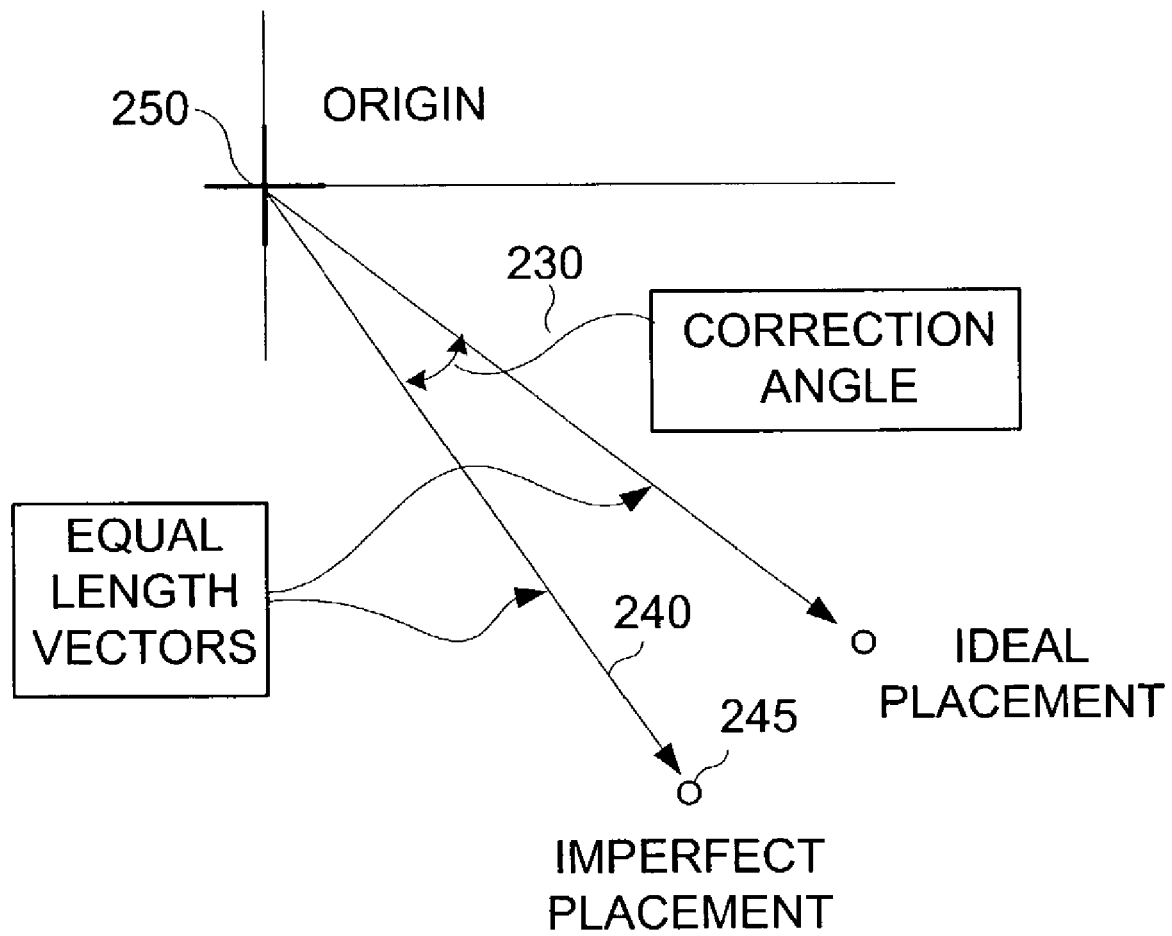

FIGS. 6 and 7 are pictorial diagrams that depict one example process for electronically aligning optical transducers with an optical sensor according to one example embodiment of an alignment unit according to the present invention. According to this example embodiment of the invention, the alignment unit 165 may receive an optical image signal 90. By using conventional scanning techniques, the alignment unit 165 may discover a first alignment reference 190 in the optical image signal 90. The alignment unit 165 may continue to scan the optical image signal 90 in order to discover a second alignment reference. Typically, the position of the second alignment reference 200, i.e. "where it is", is compared by the alignment unit 165 to where the second alignment reference should be 205 relative to the first alignment reference 190.

The alignment unit 165 may represent the location of where the second alignment reference is discovered 200 by an "unaligned angle" 210 and a standard length vector 215. Based on a priori knowledge of where the second alignment reference "should be" 205, which may be represented by the standard length vector 215 and an "aligned angle" 220, the alignment unit 165 may then determine a correction angle 230 that may be used to correct for alignment errors in the optical image signal 90.

Once the alignment unit 165 has determined a requisite correction angle 230, it may convert the optical image signal 90 into a rectangular array of pixels. The rectangular array of pixels may then be converted into a polar array of pixels; each represented by a pixel vector 240 and pixel angle. The alignment unit 165 may then rotate the polar array of pixels about an origin 250 according to the correction angle 230.

Once the polar array of pixels is rotated, it may optionally be converted back into rectangular array of pixels. In either case, the corrected polar array or the corrected rectangular array may then be correlated with the position of optical transducers corresponding to test points on an integrated circuit under test.

Figure 8:
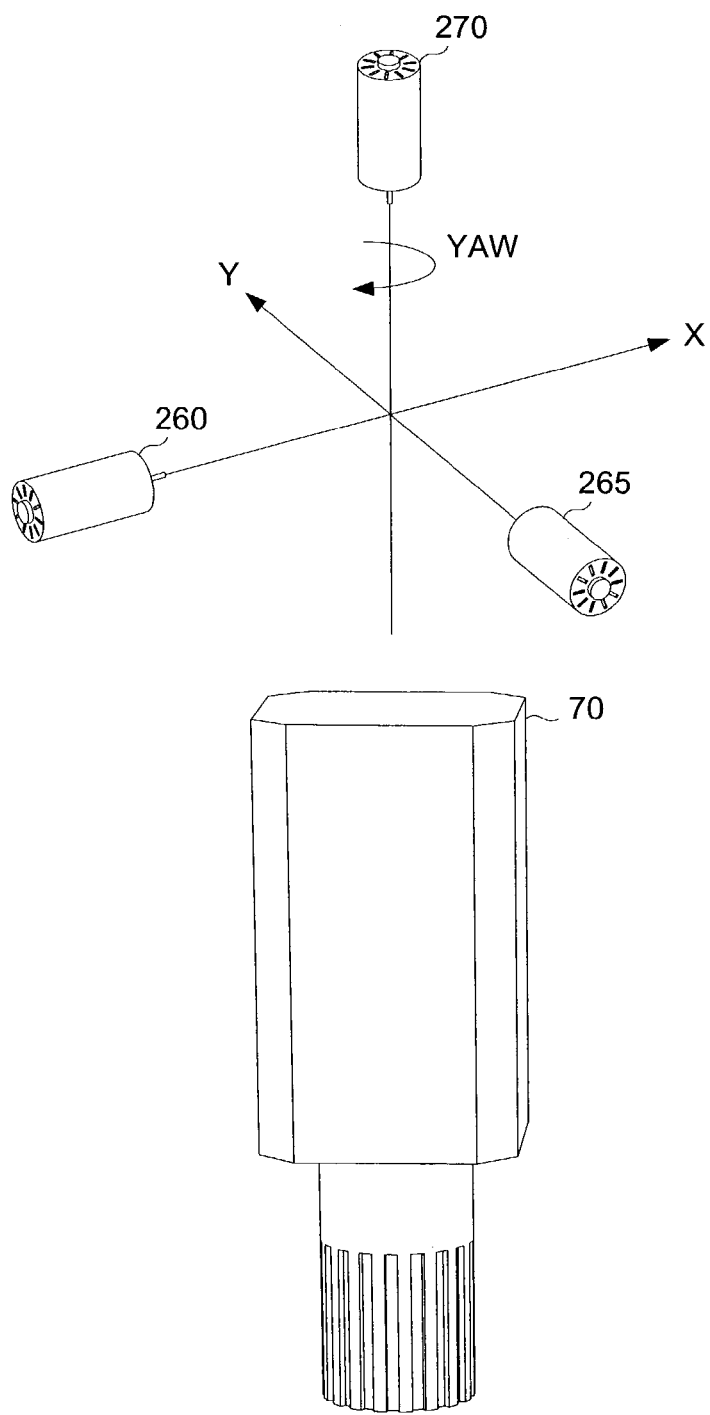
FIG. 8 is a pictorial representation of an alternative apparatus for aligning optical transducers with an optical sensor according to the present invention.

FIG. 8 is a pictorial representation of an alternative apparatus for aligning optical transducers with an optical sensor according to the present invention. In one embodiment of the present invention, the alignment unit 165 may be used to drive positioning actuators in order to physically position an optical sensor 70 relative to an integrated circuit being tested in accordance with the teachings of the present invention. According to one embodiment of the invention, separate positioning actuators may be provided for "x", "y" and "yaw" movement (260, 265, and 270). The alignment unit 165 may discover the position of a first and second alignment reference and then cause the position of the optical sensor 70 to be adjusted in order to align the optical sensor 70 relative to the perceived placement of the first and second alignment references. The positioning actuators (260, 265 and 270) may be any combination of servos, stepping motors or linear actuators. Known control mechanisms may be used to control the actuators. The actuators may be geared in order to affect proper positioning of the optical sensor 70.

While this invention has been described in terms of several preferred embodiments, it is contemplated that alternatives, modifications, permutations, and equivalents thereof will become apparent to those skilled in the art upon a reading of the specification and study of the drawings. It is therefore intended that the true spirit and scope of the present invention include all such alternatives, modifications, permutations, and equivalents.

What is claimed is:

1. An integrated circuit comprising:
   application specific circuitry having a plurality of test points;
   a plurality of optical transducers;
   a plurality of optical transducer drivers that drive the plurality of optical transducers in accordance with the state of the plurality of test points;
   wherein the application specific circuitry, the optical transducers, and the optical transducer drivers are embodied in the integrated circuit; and
   an optically perceivable alignment reference.

2. The integrated circuit of claim 1 further comprising analog-to-digital converter that drives the state of a plurality of test points according to the voltage level of an analog test point.

3. The integrated circuit of claim 1 wherein an optical transducer comprises a light emitting diode.

4. An integrated circuit comprising:
   application specific circuitry having a plurality of test points;
   a plurality of optical transducers;
   a plurality of optical transducer drivers that drive the plurality of optical transducers in accordance with the state of the plurality of test points; and
   at least one of the optical transducers driven by a state capture signal, the state capture signal indicating when a state of at least one of the optical transducers is to be sampled; and
   an optically perceivable alignment reference.

5. An integrated circuit comprising:
   application specific circuitry having a plurality of test points;
   a plurality of optical transducers;
   a plurality of optical transducer drivers that drive the plurality of optical transducers in accordance with the state of the plurality of test points; and
   wherein at least one optical transducer comprises a transmissivity variable crystal; and
   an optically perceivable alignment reference.

6. An integrated circuit comprising:
   application specific circuitry having a plurality of test points;
   a plurality of optical transducers;
   a plurality of optical transducer drivers that drive the plurality of optical transducers in accordance with the state of the plurality of test points; and
   an optically perceivable alignment reference.

* * * * *